US012802733B2

(12) United States Patent
Laurent et al.

(10) Patent No.: US 12,802,733 B2
(45) Date of Patent: Nov. 17, 2026

(54) UNBALANCED PROGRAMMED DATA STATES USING CODEWORDS IN MEMORY

(71) Applicant: Micron Technology, Inc., Boise, ID (US)

(72) Inventors: Christophe Laurent, Agrate Brianza (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 152 days.

(21) Appl. No.: 18/808,718

(22) Filed: Aug. 19, 2024

(65) Prior Publication Data

US 2024/0412768 A1 Dec. 12, 2024

Related U.S. Application Data

(63) Continuation of application No. 17/712,948, filed on Apr. 4, 2022, now Pat. No. 12,068,016.

(51) Int. Cl.

| | |
|---|---|
| ***G11C 11/22*** | (2006.01) |
| ***G11C 7/10*** | (2006.01) |
| ***G11C 16/34*** | (2006.01) |

(52) U.S. Cl.

CPC ........ *G11C 11/2275* (2013.01); *G11C 7/1006* (2013.01); *G11C 11/221* (2013.01); *G11C 11/2273* (2013.01); *G11C 16/34* (2013.01)

(58) Field of Classification Search

CPC . G11C 11/2275; G11C 7/1006; G11C 11/221; G11C 11/2273; G11C 16/34

See application file for complete search history.

(56) References Cited

U.S. PATENT DOCUMENTS

| | | | | |
|---|---|---|---|---|
| 6,771,538 | B2 * | 8/2004 | Shukuri ................. | B82Y 10/00 365/185.08 |
| 7,684,237 | B2 | 3/2010 | Moschiano | |
| 11,043,277 | B1 | 6/2021 | Pellizzer | |
| 2003/0023931 | A1 | 1/2003 | Hwang | |
| 2011/0255322 | A1 * | 10/2011 | Park ....................... | G11C 15/00 365/49.1 |
| 2013/0311714 | A1 * | 11/2013 | Varanasi ............ | G11C 16/3495 711/103 |
| 2016/0232983 | A1 | 8/2016 | Khurana | |
| 2018/0261296 | A1 * | 9/2018 | Choi ...................... | G11C 16/08 |
| 2021/0005268 | A1 | 1/2021 | Kim | |
| 2023/0030058 | A1 | 2/2023 | Lorrain | |

* cited by examiner

*Primary Examiner* — Donald HB Braswell
(74) *Attorney, Agent, or Firm* — Brooks, Cameron & Huebsch, PLLC

(57) ABSTRACT

The present disclosure includes apparatuses, methods, and systems for unbalanced programmed data states in memory. An embodiment includes a memory having a group of memory cells, and circuitry configured to determine a quantity of the memory cells of the group to program to a first data state, wherein the determined quantity of memory cells is less than or greater than half of the memory cells of the group, program the determined quantity of the memory cells of the group to the first data state, and program a remaining quantity of the memory cells of the group to a second data state.

15 Claims, 5 Drawing Sheets

332

| | 00 | 01 | 10 | 11 |
|---|---|---|---|---|
| 00 | | | | |
| 01 | | 000 | 001 | 101 |
| 10 | | 010 | 011 | 111 |
| 11 | | 100 | 110 | |

Cell Data State Values (columns)

Cell Data State Values (rows)

*FIG. 3A*

334

Cell Data State Values (columns); Cell Data State Values (rows)

| | 00 | 01 | 10 | 11 |
|---|---|---|---|---|
| 000 | | | | |
| 001 | | 0000 | 0001 | 0111 |
| 010 | | 0010 | 0011 | 0110 |
| 011 | | 0100 | 0110 | |
| 100 | | | | |
| 101 | | 1000 | 1010 | 1100 |
| 110 | | 1011 | 1001 | 1101 |
| 111 | | 1110 | 1111 | |

*FIG. 3B*

336

Cell Data State Values (columns); Cell Data State Values (rows)

| | 00 | 01 | 10 | 11 |
|---|---|---|---|---|
| 000 | | | | |
| 001 | | | | 1010 |
| 010 | | | | 0101 |
| 011 | | 0100 | 1000 | 0111 |
| 100 | | | | 0110 |
| 101 | | 0000 | 0001 | 1100 |
| 110 | | 0010 | 0011 | 1101 |
| 111 | 1001 | 1011 | 1110 | 1111 |

*FIG. 3C*

UNBALANCED PROGRAMMED DATA STATES USING CODEWORDS IN MEMORY

PRIORITY INFORMATION

This application is a Continuation of U.S. application Ser. No. 17/712,948, filed on Apr. 4, 2022, the contents of which are incorporated herein by reference.

TECHNICAL FIELD

The present disclosure relates generally to semiconductor memory and methods, and more particularly, to unbalanced programmed data states in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Memory devices can include memory cells that can store data based on the charge level of a storage element (e.g., a capacitor) or can store data based on their conductivity state. Such memory cells can be programmed to store data corresponding to a target data state by varying the charge level of the storage element (e.g., different levels of charge of the capacitor may represent different data sates) or by varying the conductivity level of the storage element. For example, sources of an electrical field or energy, such as positive or negative electrical pulses (e.g., positive or negative voltage or current pulses), can be applied to the memory cell (e.g., to the storage element of the cell) for a particular duration to program the cell to a target data state.

A memory cell can be programmed to one of a number of data states. For example, a single level memory cell (SLC) can be programmed to a targeted one of two different data states, which can be represented by the binary units 1 or 0 and can depend on whether the capacitor of the cell is charged or uncharged. As an additional example, some memory cells can be programmed to a targeted one of more than two data states (e.g., 1111, 0111, 0011, 1011, 1001, 0001, 0101, 1101, 1100, 0100, 0000, 1000, 1010, 0010, 0110, and 1110). Such cells may be referred to as multi state memory cells, multiunit cells, or multilevel cells (MLCs). MLCs can provide higher density memories without increasing the number of memory cells since each cell can represent more than one digit (e.g., more than one bit).

BRIEF DESCRIPTION OF THE DRAWINGS

FIGS. 3A, 3B, and 3C illustrate examples of data coding tables in accordance with an embodiment of the present disclosure.

DETAILED DESCRIPTION

Figure 1A:
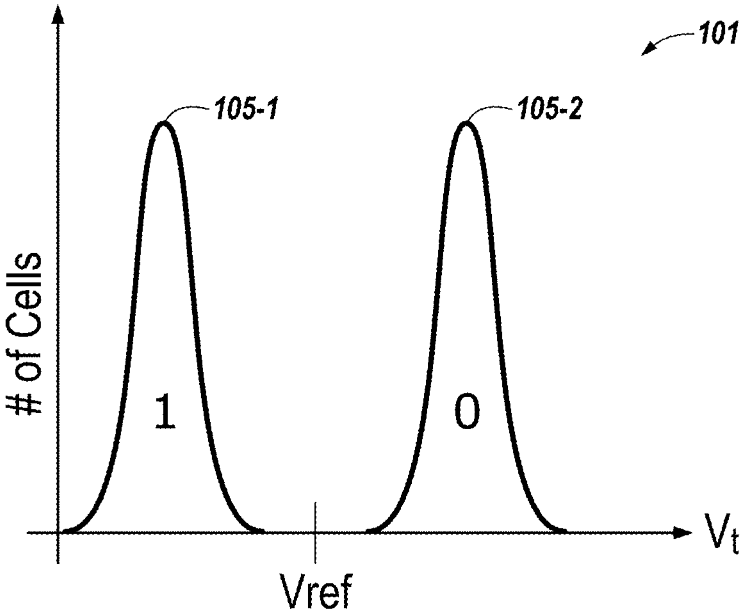
FIGS. 1A and 1B illustrate diagrams of a number of threshold voltage distributions, sensing voltages, and data assignments associated with a group of memory cells in accordance with an embodiment of the present disclosure.

The present disclosure includes apparatuses, methods, and systems for unbalanced programmed data states in memory. An embodiment includes a memory having a group of memory cells, and circuitry configured to determine a quantity of the memory cells of the group to program to a first data state, wherein the determined quantity of memory cells is less than or greater than half of the memory cells of the group, program the determined quantity of the memory cells of the group to the first data state, and program a remaining quantity of the memory cells of the group to a second data state.

A memory device can address memory cells for operations (e.g., sense and program operations) in groups (e.g., packets) called words or codewords. As memory cells are sensed and programmed, their response to positive or negative electrical pulses can change cycle after cycle (e.g., according to a specific electrical bias history of the code/word to which they belong).

Some memory devices can track memory cell variations (e.g., due to being sensed and programmed) by averaging the signals of a codeword. As such, data can be converted into a balanced codeword. Signals of the balanced codeword can be averaged to generate an appropriate reference signal for that entire codeword. That reference signal can be provided to sense amplifiers for sense operations, which can compare a memory cell signal to the reference signal.

For example, when performing a sense operation (e.g., a read operation), a memory device may access a memory cell, which may output a signal to sense circuitry that can correspond to the data state of the memory cell (e.g., to a value stored by the memory cell). To determine the data state of the memory cell, the sense circuitry may compare the signal output by the memory cell to the reference signal, which may be, for instance, a reference voltage. The reference voltage may correspond to a voltage positioned between an expected voltage level of the signal output by a memory cell programmed to a first data state (e.g., storing a first logic value) and an expected voltage level of the signal output by a memory cell programmed to a second data state (e.g., storing a second logic value). For instance, the sense circuitry may determine that the memory cell has been programmed to a first data state if the signal output by the memory cell is less than the reference voltage, and that the memory cell has been programmed to a second data state if the signal output by the memory cell is greater than the reference voltage.

If, however, the threshold voltage distributions associated with the data states of the memory cells of the codeword do not have equivalent widths and/or heights, then averaging the signals of the codeword may not provide an appropriate reference signal for that codeword. For instance, using the average signal as the reference signal for such a codeword may result in cells of the codeword being sensed to be in states to which they were not actually programmed (e.g., a cell programmed to be in the first data state may be erroneously sensed to be in the second data state, and/or vice versa). Such erroneous data sensing can reduce the performance and/or lifetime of the memory.

Embodiments of the present disclosure, however, can determine the quantity of memory cells of a codeword to be programmed to each respective data state (e.g., choose and/or select the quantity of memory cells to be in each respective threshold voltage distribution), such that the average signal of the codeword can be adjusted to provide an appropriate reference signal that will not result in the data states of the cells of the codeword being erroneously sensed. Accordingly, embodiments of the present disclosure can increase the performance and/or lifetime of memory that utilizes codewords.

As used herein, "a", "an", or "a number of" can refer to one or more of something, and "a plurality of" can refer to two or more such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures may be identified by the use of similar digits.

Figure 1B:
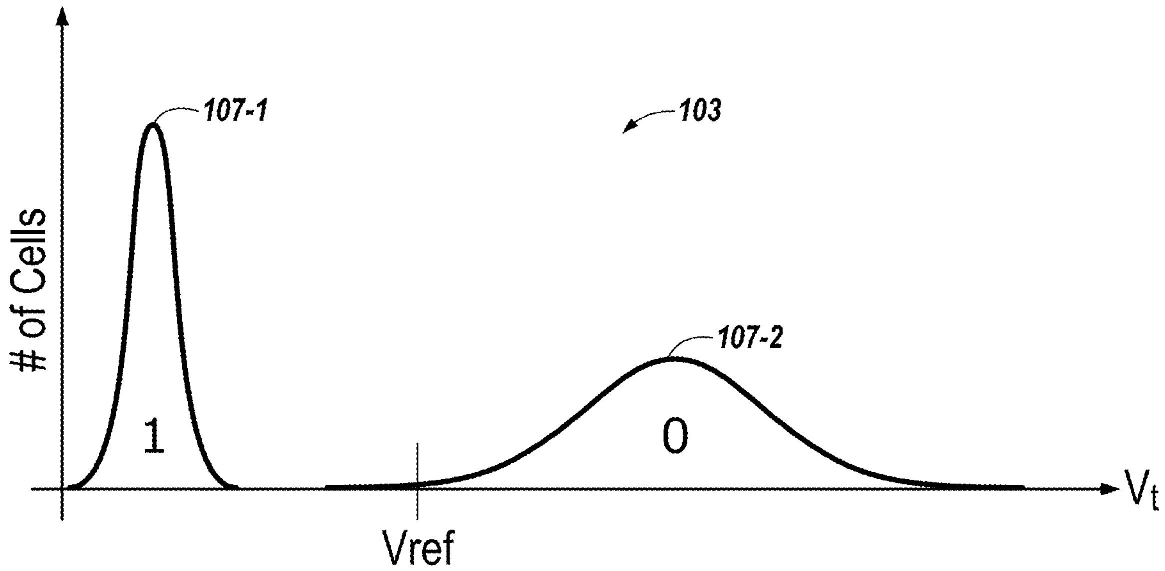

FIGS. 1A and 1B illustrate diagrams of a number of threshold voltage (Vt) distributions, sensing voltages, and data assignments associated with a group of memory cells in accordance with an embodiment of the present disclosure. The group of memory cells can be, for example, a codeword, which can refer to a logical unit of a memory device used to store data. FIG. 1A illustrates a diagram 101 of Vt distributions 105-1 and 105-2 associated with the data states of the memory cells of a first codeword, and FIG. 1B illustrates a diagram 103 of Vt distributions 107-1 and 107-2 associated with a second codeword.

As an example, the two Vt distributions 105-1 and 105-2 shown in FIG. 1A, and the two Vt distributions 107-1 and 107-2 shown in FIG. 1B, can correspond to single level (e.g., two-state) memory cells. However, embodiments of the present disclosure are not limited to single level memory cells. For example, embodiments of the present disclosure can include multilevel cells such as, for instance, triple level cells (TLCs), or quadruple level cells (QLCs). In such examples, the diagrams illustrated in FIGS. 1A and 1B would include additional Vt distributions (e.g., corresponding to each of the additional data states).

Vt distributions 105-1 and 105-2 shown in FIG. 1A, and Vt distributions 107-1 and 107-2 shown in FIG. 1B, represent two target data states (e.g., 1 and 0, respectively) to which the memory cells of the group can be programmed. Embodiments of the present disclosure, however, are not limited to these data assignments.

Vt distributions 105-1 and 105-2 shown in FIG. 1A, and Vt distributions 107-1 and 107-2 shown in FIG. 1B, can represent a quantity (e.g., number) of memory cells of the group that are programmed to the corresponding target states (e.g., 1 and 0), with the height of a Vt distribution curve indicating the quantity of cells programmed to a particular voltage within the Vt distribution (e.g., on average). The width of the Vt distribution curve indicates the range of voltages that represent a particular target state (e.g., the width of the Vt distribution curves 105-2 and 107-2 represent the range of voltages that correspond to a data value of 0 for the first and second codeword, respectively). In the example illustrated in FIG. 1A (e.g., the first codeword), the widths and heights of Vt distributions 105-1 and 105-2 are equivalent (e.g., equal). In contrast, in the example illustrated in FIG. 1B (e.g., the second codeword), the widths and heights of Vt distributions 107-1 and 107-2 are not equivalent (e.g., are different).

During a sense (e.g., read) operation to determine the respective data states stored by the memory cells of the group, a reference voltage located between the two Vt distributions (e.g., Vref) can be used to distinguish between the two data states (e.g., between states 1 and 0). For example, during a sense operation performed on a selected memory cell of the group, a sense voltage can be applied to first signal line (e.g., an access line) to which the memory cell is coupled, and the resulting voltage signal (e.g. in response to the sense voltage being applied to the access line) from the memory cell can be provided to sense circuitry via a second signal line (e.g., a sense line) to which the memory cell is coupled for comparison with the reference voltage. The data state for the selected memory cell can be determined using (e.g., by comparing) the voltage signal from that memory cell and the reference voltage.

In the examples illustrated in FIGS. 1A and 1B, the reference voltage (e.g., Vref) used to distinguish between the two data states can be determined by averaging the threshold voltages of the memory cells of the group (e.g., codeword). For the first codeword (e.g., whose Vt distribution widths and heights are equivalent), this reference voltage would be located exactly between its Vt distributions 105-1 and 105-2, as illustrated in FIG. 1A. However, for the second codeword (e.g., whose Vt distribution widths and/or heights are not equivalent), this reference voltage would not be located exactly between its Vt distributions 107-1 and 107-2. For instance, this reference voltage may be located within Vt distribution 107-2, as illustrated in FIG. 1B. As such, using this voltage as the reference voltage to sense the data states of the memory cells of the second codeword may result in some cells of that codeword being sensed to be in a state to which they were not actually programmed to. For instance, a cell programmed to a target state of 0, but whose voltage is to the left of Vref within distribution 107-2, may be erroneously sensed to be in state 1.

Embodiments of the present disclosure, however, can determine the quantity of memory cells of a codeword to be programmed to each respective data state (e.g., can choose and/or select the quantity of memory cells to be in each respective threshold voltage distribution 107-1 and 107-2), such that the average threshold voltage of the memory cells of the codeword, and therefore the reference voltage used to sense the data states of the memory cells, can be located between (e.g., exactly between) distributions 107-1 and 107-2. Using such an adjusted reference voltage can result in the data states of the cells of the codeword not being erroneously sensed.

Figure 2:
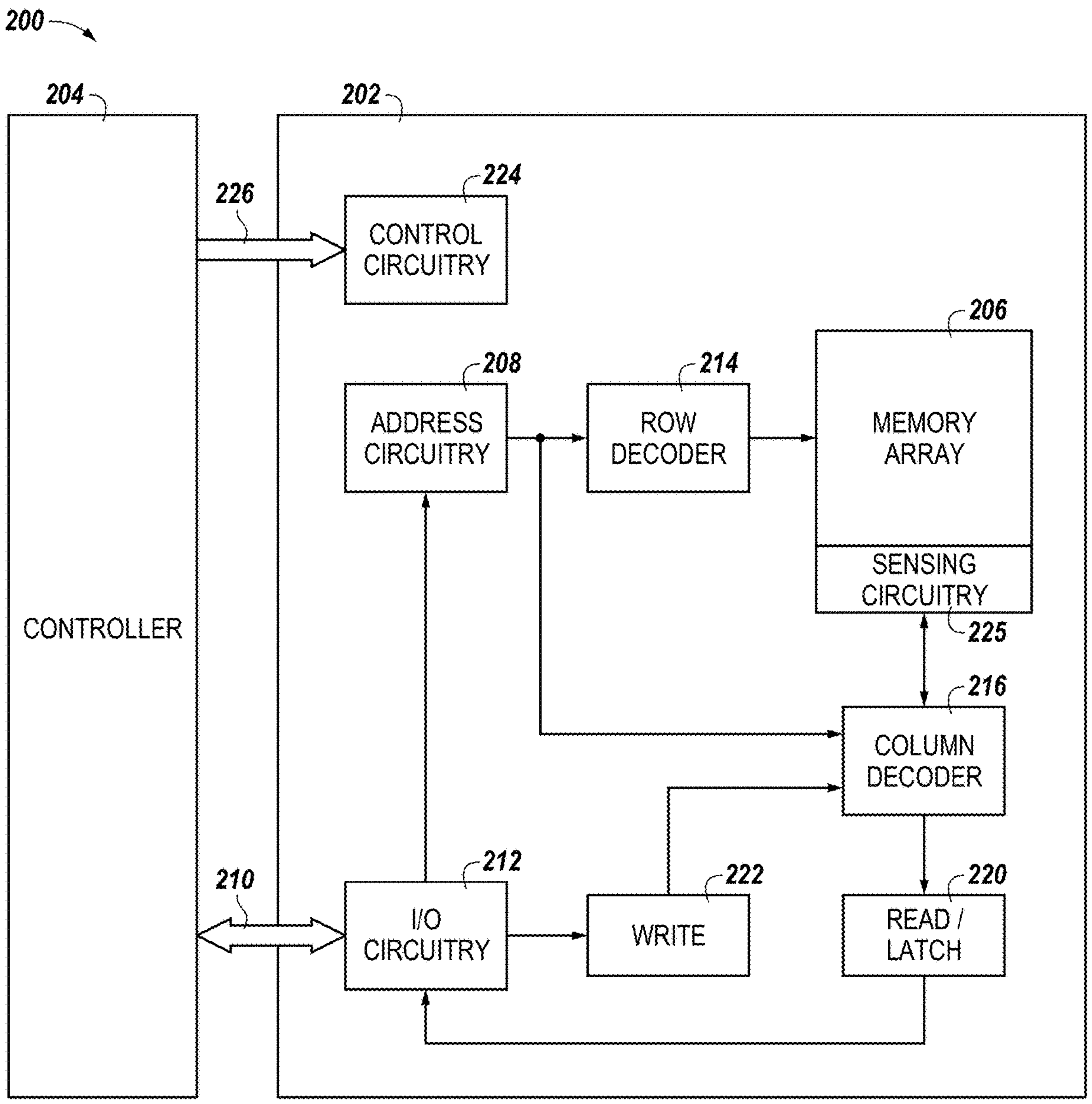
FIG. 2 is a block diagram illustration of an example apparatus in accordance with an embodiment of the present disclosure.

FIG. 2 is a block diagram illustration of an example apparatus, such as an electronic memory system 200, in accordance with an embodiment of the present disclosure.

Memory system 200 may include an apparatus, such as a memory device 202 and a controller 204, such as a memory controller (e.g., a host controller). Controller 204 might include a processor, for example. Controller 204 might be coupled to a host, for example, and may receive command signals (or commands), address signals (or addresses), and data signals (or data) from the host and may output data to the host.

Memory device 202 includes a memory array 206 of memory cells. For example, memory array 206 can include a group of memory cells, such as a codeword, as previously described herein (e.g., in connection with FIGS. 1A-1B). Memory array 206 can be, for example, a DRAM array, such as, for instance, a ferroelectric memory (e.g., FeRAM) array. That is, the memory cells of array 206 can be DRAM (e.g., FeRAM) cells. However, embodiments are not limited to a particular type of memory array. Further, although one memory array 206 is illustrated in FIG. 1 for simplicity and so as not to obscure embodiments of the present disclosure, memory device 202 can include a number of memory arrays analogous to array 206.

Memory device 202 may include address circuitry 208 to latch address signals provided over I/O connections 210 through I/O circuitry 212. Address signals may be received and decoded by a row decoder 214 and a column decoder 216 to access the memory array 206. For example, row decoder 214 and/or column decoder 216 may include drivers.

Controller 204 may sense (e.g., read) data in memory array 206 by using read/latch circuitry 220 and/or sensing circuitry 225. Read/latch circuitry 220 may read and latch data from the memory array 206. Sensing circuitry 225 may include a number of sense amplifiers coupled to memory cells of memory array 206, which may operate in combination with the read/latch circuitry 220 to sense (e.g., read) memory states from targeted memory cells. I/O circuitry 212 may be included for bi-directional data communication over the I/O connections 210 with controller 204. Write circuitry 222 may be included to program (e.g., write) data to memory array 206.

Control circuitry 224 may decode signals provided by control connections 226 from controller 204. These signals may include chip signals, write enable signals, and address latch signals that are used to control the operations on memory array 206, including data read and data write operations.

Control circuitry 224 may be included in controller 204, for example. Controller 204 may include other circuitry, firmware, software, or the like, whether alone or in combination. Controller 204 may be an external controller (e.g., in a separate die from the memory array 206, whether wholly or in part) or an internal controller (e.g., included in a same die as the memory array 206). For example, an internal controller might be a state machine or a memory sequencer.

In some examples, controller 204 can determine (e.g., choose and/or select) the quantity of memory cells of a group of memory cells (e.g., a codeword) of memory array 206 to program to different target data states (e.g., the quantity of memory cells in each respective Vt distribution associated with the group). Accordingly, the average threshold voltage of the memory cells of the group, and therefore the reference voltage used to sense the data states of the memory cells, can be located between (e.g., exactly between) the Vt distributions associated with the group.

For example, controller 204 can determine the quantity of memory cells of the group to program to a first data state (e.g., 1). This determined quantity can be less than or greater than half of the memory cells of the group (e.g., group of memory cells can be an unbalanced codeword). Controller 204 can then program the determined quantity of memory cells of the group to the first data state, and program the remaining quantity of (e.g., all remaining) memory cells of the group to a second data state (e.g., 0). That is, the remaining quantity of memory cells programmed to the second data state can comprise all the memory cells of the group not programmed to the first data state. For instance, the determined quantity of memory cells can be greater than half of the memory cells of the group, and the remaining quantity of memory cells can be less than half of the memory cells of the group.

As an example, the determined quantity of memory cells can be a particular percentage (e.g., a specific, fixed weight) of the memory cells of the group. For instance, the determined quantity can be 60%, 62.5%, or 65% of the memory cells of the group. As an additional example, the determined quantity of memory cells can be a percentage range (e.g., a nearly fixed weight) of the memory cells of the group. For instance, the determined quantity can be between 60% and 80% of the memory cells of the group. As an additional example, the determined quantity of memory cells can be greater than a particular percentage of the memory cells of the group. In such an example, the quantity of cells programmed to the first data state can be maximized to make the Vt distribution associated with the first data state much larger than the Vt distribution associated with the second data state.

Controller 204 can determine the quantity of memory cells of the group to program to the first data state by, for example, selecting (e.g., choosing) a data coding table, and balancing data that was encoded according to the selected data coding table that corresponds to the data to be programmed (e.g., balancing the message of the codeword after it has been encoded according to the coding table). For example, the determined quantity of memory cells can be a particular (e.g., specific, fixed weight) quantity obtained by balancing the data that was encoded according to the selected data coding table. That is, balancing the data that was encoded according to the coding table can provide the particular quantity of memory cells to program to the first data state. Examples of balancing data that was encoded according to data coding tables will be further described herein (e.g., in connection with FIGS. 4A and 4B).

However, in some examples (e.g., in which the determined quantity is not a specific quantity), controller 204 can determine the quantity of memory cells to program to the first data state without balancing the data that was encoded according to the selected data coding table. For instance, controller 204 may not need to balance the data that was encoded according to the selected data coding table if the table is large enough, and/or uses only fields (e.g., boxes) corresponding to a high number of the first data state, as will be further described herein.

The data coding table can be a table that codes a first, smaller quantity of data bits to data state values programmable to a second, greater quantity of memory cells. For example, the data coding table can comprise a table in which a first quantity of data bits are coded to data state values programmable to a second quantity of the memory cells of the group. The first quantity can correspond to the second quantity (e.g., the coding table can have a relationship between the quantity of data bits and the quantity of data state values), and the first quantity can be less than the second quantity. For instance, the data coding table can code three data bits to data state values for four memory cells, four data bits to data state values for five memory cells, eight data bits to data state values for ten memory cells, or 24 data bits to data state values for 32 memory cells, among other examples. Further, the data coding table can include a plurality of fields (e.g., boxes), and the data bits of the table can be included in only a subset of the plurality of fields (e.g., less than all of the boxes of the table are used). Examples of data coding tables will be further described herein (e.g., in connection with FIGS. 3A, 3B, and 3C).

A greater quantity (e.g., more) of the data bits of the data coding table (e.g., a greater number of the boxes of the table) can correspond to the first data state than the second data state, (e.g., such that a greater quantity of the cells of the group can be programmed to the 1 data state than the 0 data state), as will be further described herein (e.g., in connection with FIGS. 3A, 3B, and 3C). Further, the quantity of memory cells that are to be programmed to the first data state can correspond to the quantity of data bits of the data coding table whose value matches the first data state, as will be further described herein (e.g., in connection with FIGS. 3A, 3B, and 3C).

The data coding table (e.g., the quantity of memory cells of the group to program to the first data state) can be selected, for example, based on a characteristic of memory device 202 (e.g., memory array 206). The selected data coding table can be fixed (e.g., not change) during operation of memory device 202, or can be changed in response to a change in the characteristic of memory device 202.

The data that was encoded according to the data coding table can be balanced by, for example, applying a balancing algorithm. The balancing algorithm can be, for instance, a Knuth algorithm, such as a quantified Knuth algorithm, among other types of balancing algorithms.

During a sense operation performed on the group of memory cells, controller 204 can determine the average threshold voltage of the memory cells of the group. Controller 204 can use this determined voltage as a reference voltage during the sense operation to sense the data states of the memory cells of the group.

FIGS. 3A, 3B, and 3C illustrate examples of data coding tables in accordance with an embodiment of the present disclosure. For example, FIG. 3A illustrates a data coding table 332, FIG. 3B illustrates a data coding table 334, and FIG. 3C illustrates a data coding table 336. Data coding tables 332, 334, and 336 are examples of data coding tables that can be included in and used (e.g., selected) by controller 204 previously described in connection with FIG. 2 to determine a quantity of memory cells of a group of memory cells (e.g., of an unbalanced codeword) to program to a first data state in accordance with the present disclosure. For instance, in some embodiments, the controller can include multiple data coding tables (e.g., the controller can include each of tables 332, 334, and 336), and select one of these tables for use in determining the quantity of memory cells to program to the first data state. Further, in some embodiments, the controller can include a single data coding table (e.g., the controller can include only one of tables 332, 334, and 336), and use that table to determine the quantity of memory cells to program to the first data state. For instance, in such embodiments the data coding table included in the controller can be fixed.

As previously described herein (e.g., in connection with FIG. 2), data coding tables 332, 334, and 336 can code a first, smaller quantity of data bits to data state values programmable to a second, greater quantity of memory cells. For example, data coding table 332 illustrated in FIG. 3A codes three data bits (z, y, x) to data state values for four memory cells (c0, c1, c2, c3) and data coding tables 334 and 336 illustrated in FIGS. 3B and 3C, respectively, each code four data bits (z, y, x, w) to data state values for five memory cells (c0, c1, c2, c3, and c4). Further, each data coding table 332, 334, 336 can include a plurality of fields (e.g., boxes), and the data bits of the table can be included in only a subset of the plurality of fields (e.g., less than all of the boxes of the table are used). For example, data coding table 332 includes 16 fields, with the data bits of the table included in 8 of those fields. Further, data coding tables 334 and 336 each include 32 fields, with the data bits of the table included in 16 of those fields.

As shown in FIGS. 3A, 3B, and 3C, different combinations of the data bits of each table 332, 334, and 336 are coded to different data state values that can be programmed to the memory cells of the group. For example, in table 332, the data bit combination 000 is transformed to the encoded data combination 0, 1, 0, 1; the data bit combination 001 is transformed to the encoded data combination 0, 1, 1, 0; the data bit combination 101 is transformed to the encoded data combination 0, 1, 1, 1; the data bit combination 010 is transformed to the encoded data combination 1, 0, 0, 1; and so on. Further, in table 334, the data bit combination 0000 is transformed to the encoded data combination 0, 0, 1, 0, 1; the data bit combination 0001 is transformed to the encoded data combination 0, 0, 1, 1, 0; the data bit combination 0111 is transformed to the encoded data combination 0, 0, 1, 1, 1; the data bit combination 0010 is transformed to the encoded data combination 0, 1, 0, 0, 1; and so on. Further, in table 336, the data bit combination 1010 is transformed to the encoded data combination 0, 0, 1, 1, 1; the data bit combination 0101 is transformed to the encoded data combination 0, 1, 0, 1, 1; the data bit combination 0100 is transformed to the encoded data combination 0, 1, 1, 0, 1; the data bit combination 1000 is transformed to the encoded data combination 0, 1, 1, 1, 0; and so on.

In tables 332, 334, and 336 illustrated in FIGS. 3A, 3B, and 3C, respectively, the different combinations of the data bits (e.g., the fields of the tables that include the data bits) correspond to a greater number of 1 data states than 0 data states, such that a greater quantity of the cells of the group can be programmed to the 1 data state than the 0 data state. For example, in table 332, four data bit combinations (e.g., 000, 001, 010, and 011) correspond to two cells being programmed to the 1 data state and two cells being programmed to the 0 data state, and four data bit combinations (e.g., 101, 111, 100, and 110) correspond to three cells being programmed to the 1 data state and one cell being programmed to the 0 data state. As such, a range of 50% to 75%, with a median of 62.5%, of the cells may be programmed to the 1 data state using table 332.

Further, in table 334, four data bit combinations (e.g., 0000, 0001, 0010, and 0011) correspond to two cells being programmed to the 1 data state and three cells being programmed to the 0 data state, eight data bit combinations (e.g., 0111, 0110, 0100, 0110, 1000, 1010, 1011, and 1001) correspond to three cells being programmed to the 1 data state and two cells being programmed to the 0 data state, and four data bit combinations (e.g., 1100, 1101, 1110, and 1111) correspond to four cells being programmed to the 1 data state and one cell being programmed to the 0 data state. As such, a range of 40% to 80%, with a median of 60%, of the cells may be programmed to the 1 data state using table 334.

Further, in table 336, ten data bit combinations (e.g., 1010, 0101, 0100, 1000, 0110, 0000, 0001, 0010, 0011, and 1001) correspond to three cells being programmed to the 1 data state and two cells being programmed to the 0 data state, five data bit combinations (e.g., 0111, 1100, 1101, 1011, and 1110) correspond to four cells being programmed to the 1 data state and one cell being programmed to the 0 data state, and one data bit combination (e.g., 1111) corresponds to five cells being programmed to the 1 data state and zero cells being programmed to the 0 data state. As such, a range of 60% to 100%, with a median of 68.75%, of the cells may be programmed to the 1 data state using table 336. Further, table 336 may not be compatible with a balancing algorithm (e.g., a Knuth algorithm), which means no subsequent data balancing may be needed if table 336 is used to determine the quantity of memory cells of the group to program to the 1 data state.

Further, for tables 332 and 334, the quantity of memory cells that can be programmed to the 1 data state can correspond to the quantity of "z" data bits (e.g., the quantity of data bits in the "z" position) of the data coding table whose value is 1. For instance, for table 332, the quantity of memory cells to be programmed to the 1 data state can be given by:

$$2+Nb\_\mathrm{at}\_1(z)$$

where Nb_at_1(z) is the quantity of z bits whose value is 1. Since this quantity can be either zero or one, the quantity of memory cells that can be programmed to the 1 data state using table 332 can be two or three. As such, if table 332 is used to determine the quantity of memory cells of the group to program to the 1 data state, only the z data bits may need to be balanced (e.g., the data bits in the "y" and "x" positions of the data coding table may not need to be balanced). Further, for table 334, the quantity of memory cells to be programmed to the 1 data state can be given by:

$$2+Nb\_\mathrm{at}\_1(z,y)$$

where Nb_at_1(z, y) is the quantity of z and y bits whose value is 1. Since this quantity can be either zero, one, or two, the quantity of memory cells that can be programmed to the 1 data state using table 334 can be two, three, or four. As such, if table 334 is used to determine the quantity of memory cells of the group to program to the 1 data state, only the z and y data bits may need to be balanced (e.g., the x and w data bits may not need to be balanced).

It should be noted, however, that embodiments of the present disclosure are not limited to the three example data coding tables illustrated in FIGS. 3A, 3B, and 3C. For example, changing the quantity of data bits being coded, the quantity of memory cells to which the data bits are coded, and/or the fields of the table in which the coded data bits are included, can change the quantity of memory cells (e.g., the range and/or median of cells) that would be programmed to the 1 data state.

Figure 4A:
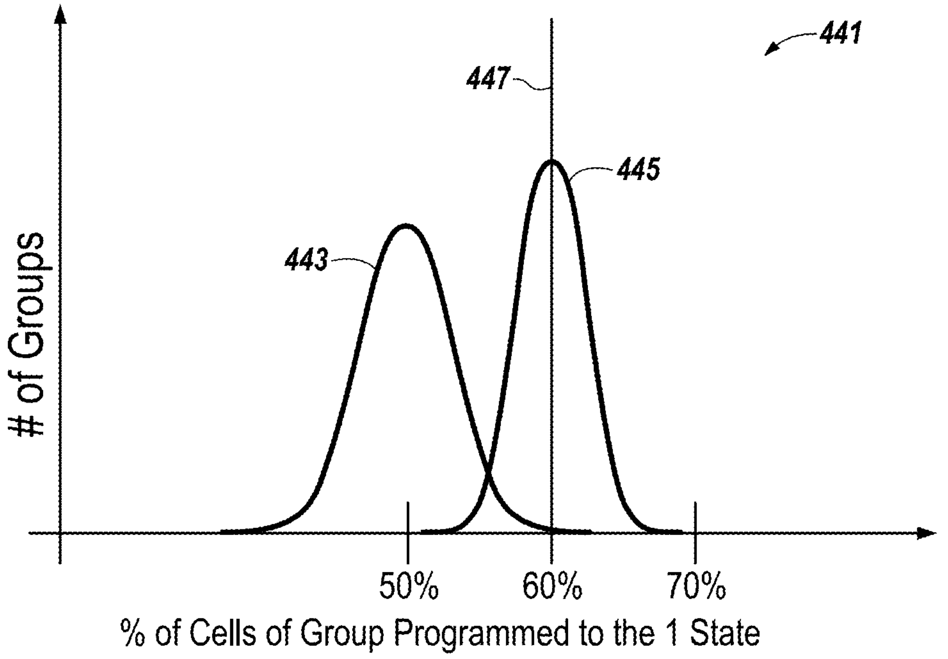
FIGS. 4A and 4B are diagrams illustrating examples of balancing data that was encoded according to a data coding table in accordance with an embodiment of the present disclosure.
Figure 4B:
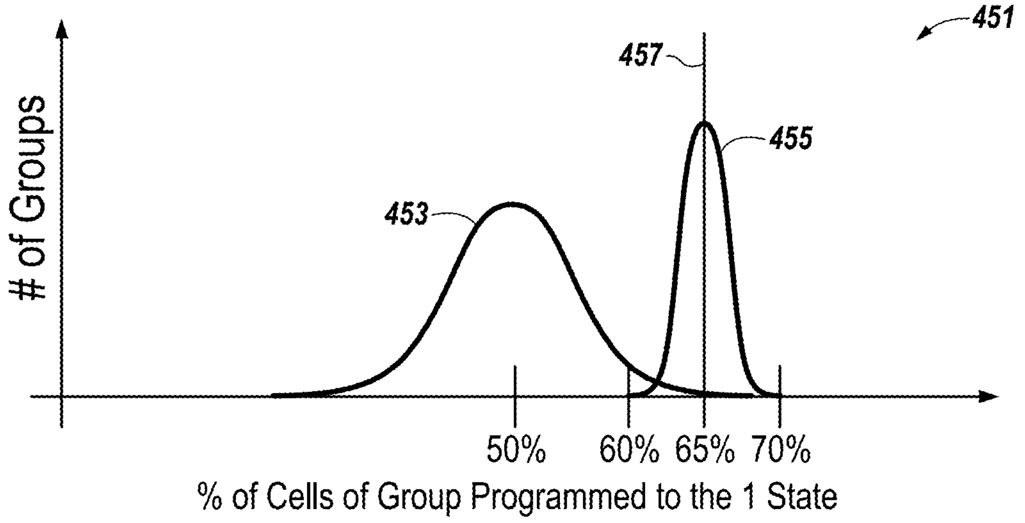

FIGS. 4A and 4B are diagrams illustrating examples of balancing data that was encoded according to a data coding table in accordance with an embodiment of the present disclosure. For example, FIG. 4A is a diagram 441 illustrating an example of balancing data that was encoded according to a data coding table that codes four data bits to data state values for five memory cells (e.g., data coding table 334 described in connection with FIG. 3B), and FIG. 4B is a diagram 451 illustrating an example of balancing data that was encoded according to a data coding table that codes eight data bits to data state values for ten memory cells.

Distribution curves 443, 445, and 447 shown in FIG. 4A, and distribution curves 453, 455, and 457 shown in FIG. 4B, can represent a quantity (e.g., number) of groups of memory cells having different percentages of their cells programmed to a first data state (e.g., the 1 data state) during program operations performed on those groups. The height of a curve indicates the quantity of groups having a particular (e.g., specific) percentage of their cells programmed to the first data state, and the width of a curve indicates the percentage range of the cells of a group that may be programmed to the first data state. The groups of memory cells can be, for example, different codewords, as previously described herein.

For example, distribution curve 443 illustrated in FIG. 4A and distribution curve 445 illustrated in FIG. 4B each represent the percentage of memory cells of each respective group programmed to the first data state during a standard program operation (e.g., a program operation in which the cells are randomly programmed to either the 1 data state or the 0 data state). As shown in FIGS. 4A and 4B, the median quantity of memory cells of a group programmed to the first data state during a standard program operation is 50%, with a wide percentage range of cells in a group that could potentially be programmed to the first data state.

Distribution curves 445 and 455 illustrated in FIGS. 4A and 4B, respectively, each represent the percentage of memory cells of each respective group programmed to the first data state using a data coding table in accordance with embodiments of the present disclosure, without balancing the data that was encoded according to the data coding table. For example, distribution curve 445 represents the percentage of memory cells of each respective group programmed to the first data state using data coding table 334 previously described in connection with FIG. 3B, and distribution curve 455 represents the percentage of memory cells of each respective group programmed to the first data state using a data coding table in which eight data bits are coded to data state values for ten memory cells.

As shown in FIGS. 4A and 4B, respectively, the median quantity of memory cells of a group programmed to the first data state during a program operation using data coding table 334 is 60%, and the median quantity of memory cells of a group programmed to the first data state during a program operation using the data coding table in which eight data bits are coded to data state values for ten memory cells is 65%. Further, as shown in FIGS. 4A and 4B, the percentage range of cells in a group that could potentially be programmed to the first data state using these data coding tables is narrower than the percentage range for a standard program operation. For instance, the width of distribution curve 445 is narrower than the width of distribution curve 443, and the width of distribution curve 455 is narrower than the width of distribution curve 453.

Distribution curve 447 illustrated in FIG. 4A represents the percentage of memory cells of each respective group programmed to the first data state after balancing the data that was encoded according to data coding table 334, and distribution curve 457 illustrated in FIG. 4B represents the percentage of memory cells of each respective group programmed to the first data state after balancing the data that was encoded according to the data table in which eight data bits are coded to data state values for ten memory cells. As shown in FIGS. 4A and 4B, distribution curves 447 and 457 do not have a width. Accordingly, the quantity of memory cells of a group programmed to the first data state after balancing the data that was encoded according to the data coding tables is a specific, fixed weight quantity. For instance, the quantity of memory cells of a group programmed to the first data state after balancing the data that was encoded according to data coding table 334 is 60%, and the quantity of memory cells of a group programmed to the first data state after balancing the data that was encoded according to the data coding table in which eight data bits are coded to data state values for ten memory cells is 65%.

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a group of memory cells; and
a controller, wherein the controller includes a number of data coding tables and is configured to:
select one of the number of data coding tables, wherein the selected one of the plurality of data coding tables remains fixed during operation of the memory;
determine, using the selected one of the number of data coding tables, a quantity of the memory cells of the group to program to a first data state;
program the determined quantity of the memory cells of the group to the first data state; and
program a remaining quantity of the memory cells of the group to a second data state.

2. The apparatus of claim 1, wherein the determined quantity of memory cells is less than half of the memory cells of the group.

3. The apparatus of claim 1, wherein the determined quantity of memory cells comprises a percentage range of the memory cells of the group.

4. The apparatus of claim 1, wherein each of the number of data coding tables code a first quantity of data bits to data state values programmable to a second quantity of memory cells of the group.

5. The apparatus of claim 4, wherein the first quantity is smaller than the second quantity.

6. The apparatus of claim 4, wherein:
each of the number of data coding tables includes a plurality of fields; and
the data bits coded by each respective data coding table are included in only a subset of the plurality of fields of that respective data coding table.

7. A method of operating memory, comprising:
determining, using a single data coding table included in a memory controller, a quantity of memory cells of a group of memory cells to program to a first data state;
programming the determined quantity of the memory cells of the group to the first data state;
programming a remaining quantity of the memory cells of the group to a second data state;
determining an average threshold voltage of the memory cells of the group while performing a sense operation on the group of memory cells; and
performing the sense operation on the group of memory cells using the determined average threshold voltage as a reference voltage.

8. The method of claim 7, wherein the determined quantity of memory cells is greater than half of the memory cells of the group.

9. The method of claim 7, wherein different combinations of data bits of the single data coding table are coded to different data state values programmable to the memory cells of the group.

10. The method of claim 9, wherein the different combinations of the data bits correspond to a greater number of data state values corresponding to the first data state than the second data state.

11. An apparatus, comprising:
a memory having a group of memory cells; and
a controller, wherein the controller includes a plurality of data coding tables and is configured to:
select one of the plurality of data coding tables, wherein the selected one of the plurality of data coding tables remains fixed during operation of the memory;
determine, using the selected data coding table, a quantity of the memory cells of the group to program to a first data state;
program the determined quantity of the memory cells of the group to the first data state; and
program a remaining quantity of the memory cells of the group to a second data state.

12. The apparatus of claim 11, wherein the determined quantity of memory cells comprises greater than a particular percentage of the memory cells of the group.

13. The apparatus of claim 11, wherein the plurality of data coding tables comprises three data coding tables.

14. The apparatus of claim 11, wherein:
one of the plurality of data coding tables codes three data bits to data state values programmable to four memory cells of the group; and
another one of the plurality of data coding tables codes four data bits to data state values programmable to five memory cells of the group.

15. The apparatus of claim 11, wherein the controller is configured to select the one of the plurality of data coding tables based on a characteristic of the memory.

* * * * *